(12) United States Patent
Yeh et al.

(10) Patent No.: US 6,970,380 B1
(45) Date of Patent: Nov. 29, 2005

(54) METHOD FOR PROGRAMMING NON-VOLATILE MEMORY

(75) Inventors: Chih-Chieh Yeh, Hsinchu (TW); Wen-Jer Tsai, Hsinchu (TW)

(73) Assignee: MACRONIX International Co. Ltd., Hsinchu (TW)

( * ) Notice: Subject to any disclaimer, the term of this patent is extended or adjusted under 35 U.S.C. 154(b) by 0 days.

(21) Appl. No.: 10/711,514

(22) Filed: Sep. 23, 2004

(51) Int. Cl.[7] .............................................. G11C 16/04
(52) U.S. Cl. ............................. 365/185.03; 365/185.24
(58) Field of Search ...................... 365/185.03, 185.24, 365/185.14, 185.28

(56) References Cited

U.S. PATENT DOCUMENTS 6,078,519 A * 6/2000 Kanamitsu et al. ..... 365/185.03
6,459,621 B1 * 10/2002 Kawahara et al. ...... 365/185.24

* cited by examiner

Primary Examiner—Thong Q. Le
(74) Attorney, Agent, or Firm—Jiang Chyun IP Office

(57) ABSTRACT

A method for programming a non-volatile memory is described. In the method, a reference level is selected according to the level distribution of the memory cells in a storage state, and then predetermined memory cells are programmed to a next storage state according to the reference level. The reference level falls between the cell level distribution of the storage state and that of the next storage state.

16 Claims, 3 Drawing Sheets

METHOD FOR PROGRAMMING NON-VOLATILE MEMORY

BACKGROUND OF THE INVENTION

1. Field of the Invention

The present invention relates to a method for operating a memory device, and more particularly, to a method for programming a non-volatile memory.

2. Description of Related Art

Since programmable non-volatile memory can be used to improve flexibility of circuit design and has reduced weight and capability to retain data even when the power is down, it is widely applied in related fields. In conventional methods for programming programmable non-volatile memory, fixed reference levels are always used to distinguish the data storage states (referred to as "storage state" hereinafter) of the memory cells, and the reference level may be a reference level of current or threshold voltage $V_T$.

For example, a one-time programmable (OTP) memory capable of storing one bit per cell is programmed using one fixed reference level, while a multi-level cell (MLC) memory or a multi-time programmable (MTP) memory is programmed using multiple fixed reference levels, as shown in FIGS. 1–2. Briefly, FIG. 1(A) shows an ideal relationship between multiple fixed reference levels and the cell level distributions of all storage states in a MLC memory of two bits per cell. FIG. 2(A) shows ideal relationships between multiple fixed reference levels and the cell level distributions of both storage states in a MTP memory after the MTP memory is programmed first time and second time, respectively.

However, using fixed reference levels tends to restrict the programming speed of a MLC or MTP non-volatile memory. This is because the degree of pumping charges into a memory cell is difficult to stably control when the programming speed is increased, so that over-programming easily occurs to broaden the level distribution of memory cells. Therefore, as shown in FIG. 1(B) or 2(B), the inter-state window (represented by "w") between two storage states of the MLC or MTP memory becomes narrower, so that reading errors are easily caused.

SUMMARY OF THE INVENTION

Accordingly, one object of this invention is to provide a method for programming a non-volatile memory, which can avoid the problems of over-programming and the inter-state window narrowing.

Another object of this invention is to provide a method for programming a non-volatile memory, which allows a higher programming speed to be used.

Yet another object of this invention is to provide a method for programming a multi-level cell (MLC) non-volatile memory, which is based on the method for programming a non-volatile memory of this invention.

Still another object of this invention is to provide a method for programming a multi-time programmable (MTP) non-volatile memory, which is based on the method for programming a non-volatile memory of this invention.

In the method for programming a non-volatile memory of this invention, a reference level is selected according to the level distribution of the memory cells in a storage state, and then predetermined memory cells are programmed to the next storage state according to the reference level. The reference level falls between the cell level distribution of the storage state and that of the next storage state. Here, the so-called "level" may be a current level or a threshold voltage level depending on the type of the non-volatile memory.

In a preferred embodiment of this invention, the cell level of the next storage state is higher than that of the current storage state, and the reference level falls between the highest cell level of the current storage state and the lowest cell level of the next storage state. In addition, the non-volatile memory may be a one-time programmable (OPT) memory, a multi-time programmable (MTP) memory, a multi-level cell (MLC) memory, or a programmable resistor with erase-less memory (PREM), etc.

The method for programming a MLC non-volatile memory of this invention starts from the programming of the storage state with lowest level, wherein the MLC non-volatile memory can have a first storage state up to an $N^{th}$ storage state in an ascending order. Firstly, the initial value of the storage state indicator i is set to 1. The following steps are then repeated until the $N^{th}$ storage state has been programmed: (a) an $i^{th}$ reference level is selected according to the level distribution of the memory cells in the $i^{th}$ storage state; and (b) predetermined memory cells are programmed to an $(i+1)^{th}$ storage state according to the $i^{th}$ reference level. The value of i is incremented by 1 before each repetition, and the $i^{th}$ reference level falls between the highest cell level of the $i^{th}$ storage state and the lowest cell level of the $(i+1)^{th}$ storage state.

The method for programming a MTP non-volatile memory of this invention is described as follows. In this method, first, a reference level is selected according to the level distribution of all memory cells. Then, each memory cell is reset to a first storage state, and a part of the memory cells are programmed to a second storage state according to the reference level. The reference level falls between the highest cell level of the first storage state and the lowest cell level of the second storage state.

Since the method for programming a non-volatile memory of this invention actively selects a reference level according to the cell level distribution of each storage state and then programs predetermined memory cells to the next storage state according to the reference level, the inter-state window is not narrowed. Therefore, this invention can reduce the reading errors. In addition, since the reference level is adjustable to match the real level distribution of memory cells, the method of this invention allows a broader level distribution of memory cells. That is, a higher programming speed is allowed.

It is to be understood that both the foregoing general description and the following detailed description are exemplary, and are intended to provide further explanation of the invention as claimed.

DESCRIPTION OF THE PREFERRED EMBODIMENTS

It is noted that though the methods for programming a MLC non-volatile memory and a MTP non-volatile memory, respectively, are exemplified hereinafter, this invention can also be applied to a less complicated OTP memory or a more complicated MLC or MTP non-volatile memory according to the spirit of this invention.

Figure 1:
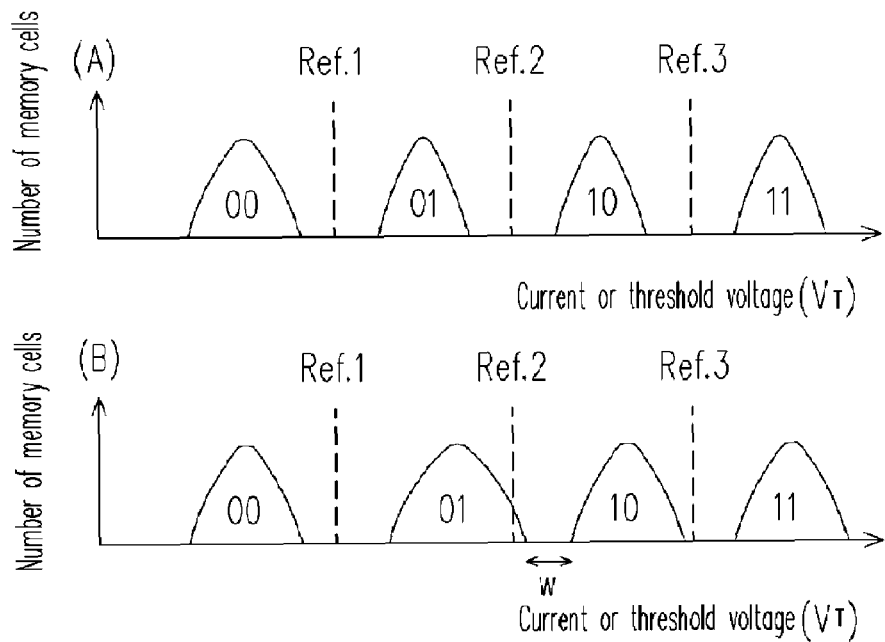
FIG. 1(A) schematically shows an ideal relationship between the fixed reference levels and the level distributions of the memory cells in a MLC memory of two bits per cell, and FIG. 1(B) schematically shows an example of over-programming.
Figure 2:
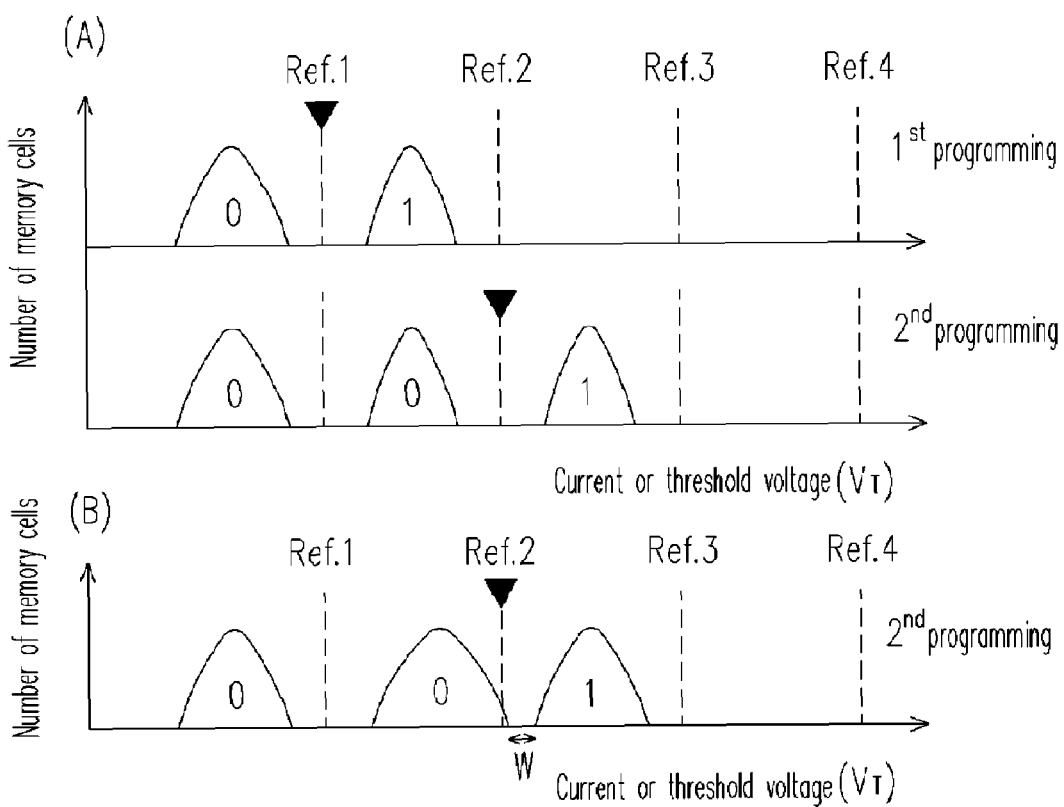
FIG. 2(A) schematically shows an ideal relationship between the fixed reference levels and the cell level distributions of both storage states in a MTP memory after the MTP memory is programmed first time and second time, respectively, and FIG. 2(B) schematically shows an example of over-programming.
Figure 3:
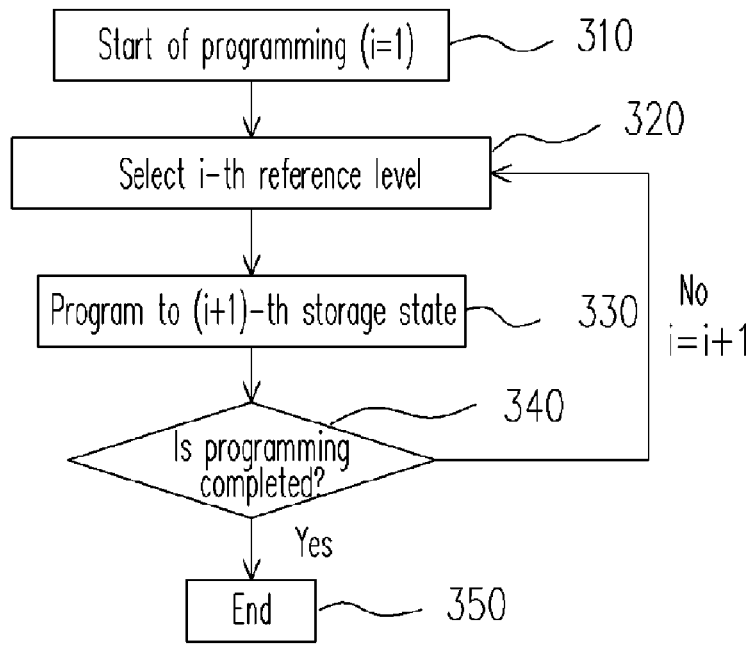
FIG. 3 is a flow chart illustrating a method for programming a MLC non-volatile memory according to a preferred embodiment of this invention.

FIG. 3 is a flow chart illustrating a method for programming a MLC non-volatile memory according to the preferred embodiment of the present invention. When the programming is just started (step 310), the initial value of the storage state indicator "i" is set to 1. Then, an $i^{th}$ reference level is selected according to the level distribution of the memory cells in the $i^{th}$ storage state (step 320), and its value is higher than the highest cell level of the $i^{th}$ storage state. Then, predetermined memory cells are programmed to an $(i+1)^{th}$ storage state according to the $i^{th}$ reference level (step 330), and the lowest cell level of the $(i+1)^{th}$ storage state is higher than the $i^{th}$ reference level. Then, it is determined whether the programming is completed or not (step 340), i.e., whether the storage state of highest level has been programmed or not. If the programming is not yet completed, the process returns to step 320 and repeats the steps 320 to 340 until the programming of the storage state of highest level is completed (step 350), wherein the value of i is incremented by 1 before each repetition.

Figure 4:
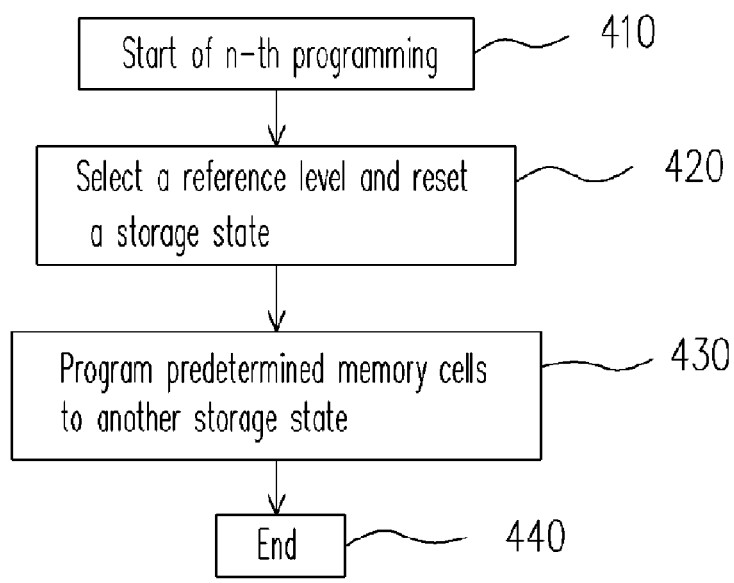
FIG. 4 is a flow chart illustrating a method for programming a MTP non-volatile memory according to the preferred embodiment of this invention.

FIG. 4 is a flow chart illustrating a method for programming a MTP non-volatile memory according to the preferred embodiment of the present invention. After the programming is started (step 410), a reference level is selected according to the level distribution of the memory cells in the MTP non-volatile memory (step 420), having a value higher than the highest level of the memory cells. Meanwhile, the storage state of each memory cell is reset to a specific storage state (step 420). Then, a predetermined part of the memory cells are programmed to another storage state according to the reference level (step 430), thus completing the programming operation (step 440). The lowest cell level of the latter storage state is higher than the reference level.

Figure 5:
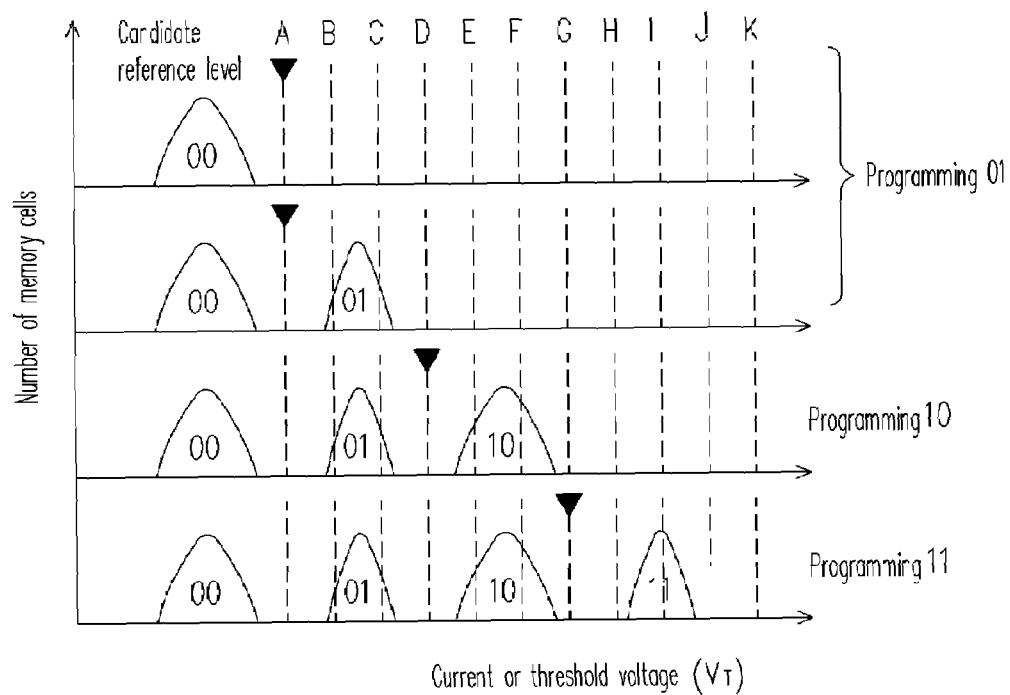
FIG. 5 schematically shows an example of the method for programming a MLC non-volatile memory of two bits per cell according to the preferred embodiment of this invention.

FIG. 5 schematically shows an example of the method for programming a MLC non-volatile memory according to the preferred embodiment of this invention, wherein each memory cell can store 2 bits and has four storage states, 00, 01, 10, and 11, in an ascending order of cell level. As shown in FIG. 5, the level distribution of all memory cells that have not been programmed is determined firstly, which is referred as the cell level distribution of the first storage state (00), and then a level higher than the highest cell level of the storage state 00 is selected as a first reference level. Thereafter, predetermined memory cells are programmed to the second storage state (01) according to the first reference level, and the lowest cell level of the storage state 01 is higher than the first reference level. Then, similar steps are repeated to determine a second reference level, program the third storage state (10), determine the third reference level and program the fourth storage state (11) sequentially.

In addition, each reference level mentioned above can be selected from multiple candidate reference levels which are predetermined before the programming. Referring to FIG. 5, for example, multiple candidate reference levels A–K are predetermined before the programming. After the cell level distribution of the storage state "00" is determined, the candidate reference level A satisfying a predetermined inter-state window is selected from the candidate reference levels A–K whose values are higher than the highest cell level of the storage state "00" as a first reference level. After the programming of the storage state "01" according to the first reference level is completed, the candidate reference level D satisfying a predetermined inter-state window is selected from the candidate reference levels D–K whose levels are higher than the highest cell level of the storage state "01" as a second reference level. Similarly, after the programming of the storage state "10" according to the second reference level is completed, the candidate reference level G satisfying a predetermined inter-state window is selected from the candidate reference levels G–K whose levels are higher than the highest cell level of the storage state "10" as a third reference level. Finally, the storage state "11" is programmed according to the third reference level.

Furthermore, the MLC non-volatile memory mentioned above is, for example, a programmable resistor with erase-less memory (PREM), in which each memory cell includes a P-type semiconductor layer and a N-type semiconductor layer which are isolated by a very thin dielectric layer. To program a memory cell, the current level of the same is set by applying a voltage thereto to cause accumulated breakdown effect of the dielectric layer, wherein the reference level is a current level. A PREM is characterized in that the cell current increases along with increases of the programming voltage and the programming time, so that a memory cell can be programmed to one of multiple different levels. Therefore, the PREM can be used as a MLC non-volatile memory. Meanwhile, since the accumulated breakdown effect is an irreversible process, the programming must start from the storage state of lowest level when a PREM is used as the MLC non-volatile memory.

In addition, although the case of each memory cell storing 2 bits is exemplified above, the scope of this invention is not necessarily restricted to it. This invention can also be applied to a programmable non-volatile memory that stores 3 or more bits per cell.

Figure 6:
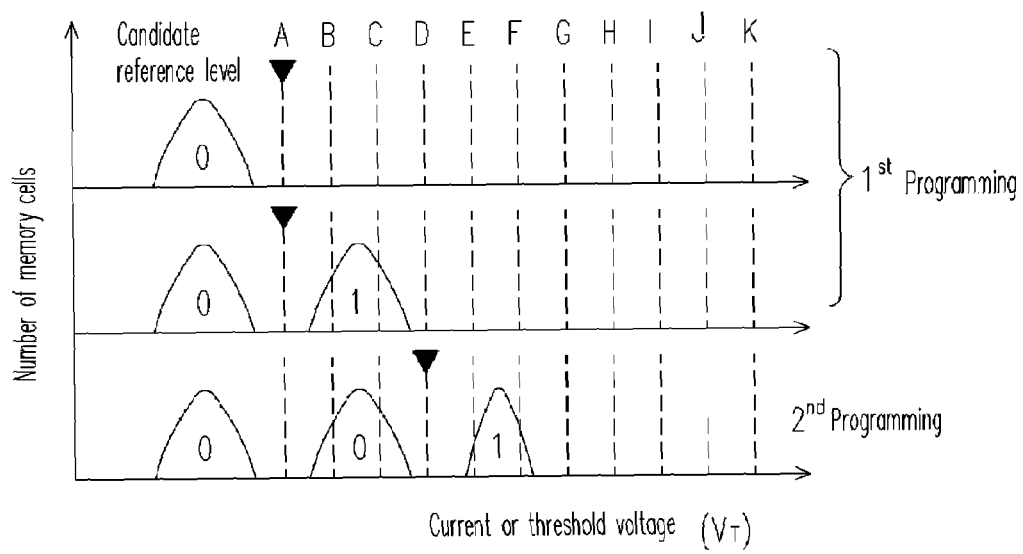
FIG. 6 schematically shows an example of the method for programming a MTP non-volatile memory according to the preferred embodiment of this invention.

FIG. 6 schematically shows an example of the method for programming a MTP non-volatile memory according to the preferred embodiment of this invention, wherein each memory cell stores one bit and the cell level of the storage state "1" is higher than that of the storage state "0". As shown in FIG. 6, in the first-time programming, the level distribution of all memory cells having not been programmed is determined, and then a first reference level is selected according to the level distribution, having a value higher than the highest level of the memory cells. Then, the storage state of each memory cell is reset to the state "0", and predetermined memory cells are programmed to the storage state "1" according to the first reference level, wherein the lowest level of the programmed memory cells is higher than the reference level. Afterwards, when a second—time programming is required, the cell level distribution of the storage state "1" is determined, and a second reference level is selected according to the cell level distribution, having a value higher than the highest cell level of the storage state "1". Then, the storage state of each memory cell is reset to the state "0", and predetermined memory cells are programmed to the storage state "1" according to the second reference level, wherein the lowest level of the newly programmed memory cells is higher than the second reference level. With similar steps, the third-time programming and subsequent programming processes can be performed.

Similarly, each reference level mentioned above can be selected from multiple candidate reference levels which are predetermined before the first-time programming. Referring to FIG. 6, in such a case, multiple candidate reference levels A–K are predetermined before the programming. After the level distribution of all memory cells having not been programmed is determined, the candidate reference level A satisfying the required inter-state window is selected from the candidate reference levels A–K whose levels are higher than the highest level of the memory cells as a reference level. In the subsequent second-time programming, after the cell level distribution of the storage state "1" is determined, the candidate reference level D satisfying the required inter-state window is selected from the candidate reference levels D–K whose levels are higher than the highest cell level of the storage state "1" as a reference level.

In addition, the MTP non-volatile memory mentioned above is, for example, a PREM described above. As mentioned before, since the memory cell current of a PREM increases along with increase of the programming time, it is possible to raise the current level of a memory cell more than one times within a valid range, as shown in FIG. 6. Therefore, a PREM can be used as a MTP non-volatile memory mentioned above. In addition, since the accumulated breakdown effect is an irreversible process, it is only possible to raise the current level of a memory cell in the programming of each time.

Since the method for programming a non-volatile memory of this invention selects a reference level according to the real cell level distribution of a storage state, the inter-state window is not narrowed to cause reading errors. In addition, since the reference level is adjustable to satisfy the real cell level distribution of the storage state, the method of this invention allows a broader level distribution of a storage state. In other words, a higher programming speed is allowed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for programming a non-volatile memory, comprising:
    giving a level distribution of a plurality of memory cells in a storage state in the non-volatile memory;
    selecting a reference level according to the given level distribution; and
    making a plurality of predetermined memory cells to have a cell level distribution of a next storage state according to the reference level, wherein
    the reference level falls between the cell level distribution of the memory cells in the current storage state and the cell level distribution of the memory cells in the next storage state.

2. The method of claim 1, wherein the levels of the memory cells in the next storage state are higher than the levels of the memory cells in the current storage state, and the reference level fall between a highest level of the memory cells in the current storage state and a lowest level of the memory cells in the next storage state.

3. The method of claim 2, wherein selecting the reference level comprises:
    predetermining a plurality of candidate reference levels; and
    selecting one candidate reference level from the candidate reference levels whose levels are higher than the highest level of the memory cells in the storage state as the reference level.

4. The method of claim 1, wherein the non-volatile memory is a one-time programmable (OTP) memory, a multi-time programmable (MTP) memory, a multi-level cell (MLC) memory, or a programmable resistor with erase-less memory (PREM).

5. The method of claim 1, wherein the storage state of a memory cell depends on its cell current, and the reference level is a current reference level.

6. The method of claim 1, wherein the storage state of a memory cell depends on its threshold voltage, and the reference level is a threshold voltage reference level.

7. A method for programming a multi-level cell (non-volatile memory whose memory cells having a first storage state up to an $N^{th}$ storage state in an ascending order of level, the method comprising:
    (a) giving a level distribution of the memory cells in an $i^{th}$ storage state;
    (b) selecting an $i^{th}$ reference level according to the given level distribution of the memory cells in the $i^{th}$ storage state;
    (c) making a plurality of memory cells have a cell level distribution of a $(i+1)^{th}$ storage state according to the $i^{th}$ reference level; and
    repeating steps (a) to (c) until programming of the $N^{th}$ storage state is completed wherein an initial value of i is 1, the value of i is incremented by 1 before each repetition, and the $i^{th}$ reference level falls between a highest level of the memory cells in the $i^{th}$ storage state and a lowest level of the memory cells in the $(i+1)^{th}$ storage state.

8. The method of claim 7, further comprising:
    predetermining a plurality of candidate reference levels before steps (a) and (b); and step (a) comprising:
    selecting one candidate reference level from the candidate reference levels whose levels are higher than a highest level of the memory cells in the $i^{th}$ storage state as an $i^{th}$ reference level.

9. The method of claim 7, wherein the storage state of a memory cell depends on its threshold voltage, and the reference level is a threshold voltage reference level.

10. The method of claim 7, wherein the storage state of a memory cell depends on its cell current, and the reference level is a current reference level.

11. The method of claim 10, wherein the MLC non-volatile memory comprises
    a programmable resistor with erase-less memory (PREM).

12. A method for programming a multi-time programmable (MTP) non-volatile memory, comprising:
    giving a level distribution of memory cells of the MTP non-volatile memory;

selecting a reference level according to the given level distribution of the memory cells resetting a storage state of each of the memory cells to fist storage state; and making a plurality of predetermined memory cells have a cell level distribution of a second storage state according to the reference level, wherein the reference level falls between a highest level of the memory cells in the first storage state and a lowest level of the memory cells in the second storage state.

13. The method of claim 12, wherein selecting the reference level comprises:

predetermining a plurality of candidate reference levels; and selecting one candidate reference level from the candidate reference levels whose level are higher than the highest level of the memory cells as the reference level.

14. The method of claim 12, wherein the storage state of a memory cell depends on its threshold voltage, and the reference level is a threshold voltage reference level.

15. The method of claim 12, wherein the storage state of a memory cell depends on its cell current, and the reference level is a current reference level.

16. The method of claim 15, wherein the MTP nonvolatile memory comprises a programmable resistor with erase-less memory (PREM).

* * * * *